United States Patent
Winkler et al.

(10) Patent No.: US 8,044,370 B2
(45) Date of Patent: Oct. 25, 2011

(54) GAS ION SOURCE WITH HIGH MECHANICAL STABILITY

(75) Inventors: Dieter Winkler, Munich (DE); Thomas Jasinski, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 508 days.

(21) Appl. No.: 12/199,574

(22) Filed: Aug. 27, 2008

(65) Prior Publication Data

US 2009/0057566 A1 Mar. 5, 2009

(30) Foreign Application Priority Data

Aug. 27, 2007 (EP) .................................... 07016766

(51) Int. Cl.
*H01T 23/00* (2006.01)
(52) U.S. Cl. ............... 250/423 F; 250/423 R; 250/306; 250/307; 250/309; 250/492.3
(58) Field of Classification Search ............. 250/423 R, 250/423 F, 306, 307, 309, 492.1, 492.3
See application file for complete search history.

(56) References Cited

U.S. PATENT DOCUMENTS

| 2007/0215802 | A1* | 9/2007 | Ward et al. | 250/309 |
| 2007/0221843 | A1* | 9/2007 | Ward et al. | 250/309 |
| 2008/0217555 | A1* | 9/2008 | Ward et al. | 250/423 F |
| 2009/0001266 | A1* | 1/2009 | Frosien | 250/307 |

FOREIGN PATENT DOCUMENTS

| DE | 4133121 | 4/1993 |
| WO | WO 98/28776 | 7/1998 |

OTHER PUBLICATIONS

Wilbertz, et al ("Recent progress in Gas Field Ion Source technology" Proceedings of SPIE vol. 2194, 1994, pp. 407-417; XP008043021).*
Bott, et al ("Design principles of a variable temperature scanning tunneling microscope" Rev. Sci. Instrum. 66(8) Aug. 1995, pp. 4135-4139; XP000525607).*
C. Wilbertz, et al; "Recent Progress in Gas Field Ion Source Technology"; Proceedings of SPIE; 1994; pp. 407-417; vol. 2194; XP 008043021.
C. Orloff, et al; "Angular Intensity of a gas-phase field ionization source"; J. Appl. Phys. 50(9), Sep. 1979; pp. 6026-6027; XP007903677.
G. Hanson, et al: "H2 and rare gas field ion source with high angular current"; J. Vac. Sci. Technol., 16(6), Nov./Dec. 1979; pp. 1875-1878; Ithaca, New York XP007903682.
M. Haridas, et al; "Cryogenic-Scanning Electron Microscopy as a Technique to Image Sol-to-Gel Transformation in Chelated Alkoxide Systems"; Ceramics International 22 (1996); pp. 155-159; Great Britain; XP004040532A.

(Continued)

*Primary Examiner* — Michael Maskell
(74) *Attorney, Agent, or Firm* — Patterson & Sheridan, L.L.P.

(57) ABSTRACT

A gas field ion source is described for a charged particle beam device having a charged particle beam column. The gas field ion source includes an emitter unit, a cooling unit, and a thermal conductivity unit for thermal conductivity from the cooling unit to the emitter unit, wherein the thermal conductivity unit is adapted for reduction of vibration transfer from the cooling unit to the emitter unit.

15 Claims, 5 Drawing Sheets

OTHER PUBLICATIONS

M. Bott, et al; "Design Principles of a variable temperature scanning tunneling microscope"; Rev. Sci. Instrum. 66(8), Aug. 1995; pp. 4135-4139; Woodbury, NY; XP000525607.

J. Eades; "A helium-cooled specimen stage for electron microscopy"; J. Phys. E: Sci. Instrum., vol. 15, 1982; pp. 184-186; Great Britain; XP0020016757.

C. Wilbertz, et al; "A focused gas-ion beam system for submicron application"; Nuclear Instruments & Methods in Physics Research, section B; Elsevier Science Publishers B.V.; 1992; pp. 120-124; XP008043027.

Extended European Search Report; May 8, 2008; Application No. 07016766.3-2208.

* cited by examiner

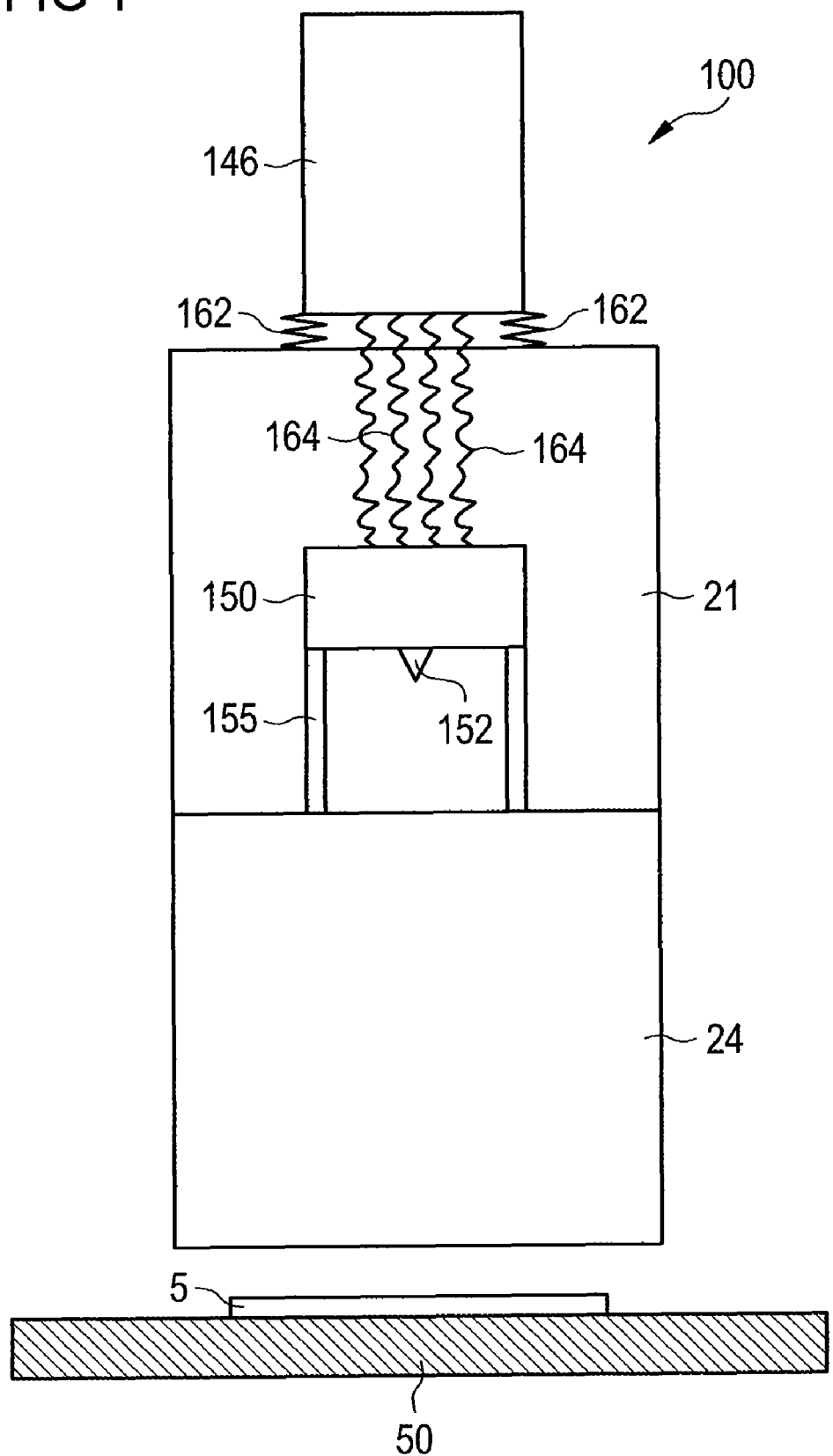

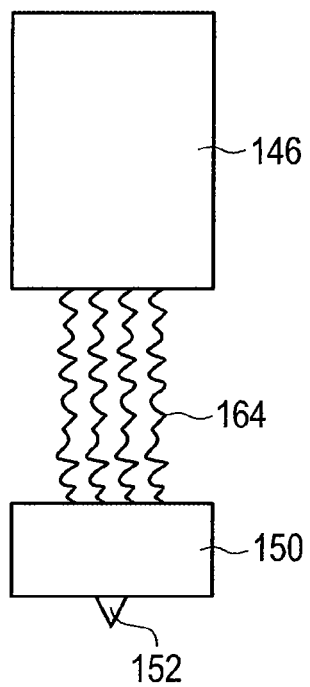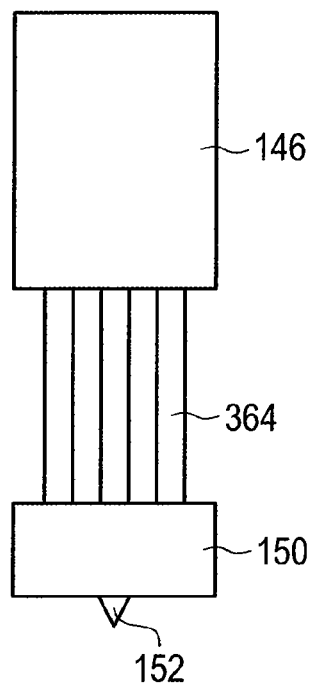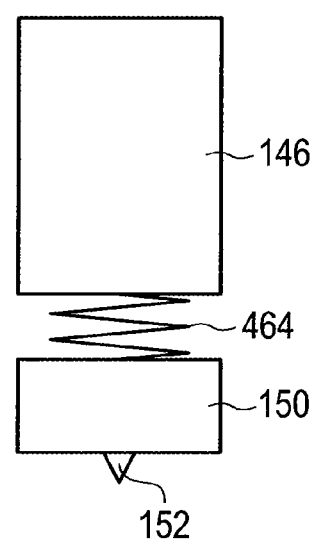

US 8,044,370 B2

GAS ION SOURCE WITH HIGH MECHANICAL STABILITY

FIELD OF THE INVENTION

Embodiments described herein generally relate to a charged particle beam device and a method of manufacturing and/or maintaining charged particle beam devices. In particular, embodiments relate to a gas field ion source of a charged particle beam device. More particularly, it relates to mechanical stability of gas field ion sources. Specifically, it relates to a gas field ion source, a charged particle beam device and a method of manufacturing a gas field ion source.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring is often done with charged particle beams which are generated and focused in charged particle beam devices. Examples of charged particle beam devices are electron microscopes, electron beam pattern generators, ion microscopes as well as ion beam pattern generators. Charged particle beams, in particular ion beams, offer superior spatial resolution compared to photon beams, due to their short wave lengths at comparable particle energy.

Besides electron microscopes, which include electron sources, microscopes including gas field ion sources for charged particle beam devices are considered. Thereby, for example, an increase in resolution might be realized. Accordingly, gas field ion sources are promising for use in very high resolution applications. In order to enable very high resolutions, a variety of system requirements have to be considered.

SUMMARY OF THE INVENTION

In light of the above, in at least one embodiment the present invention provides a gas field ion source according to independent claim 1, a charged particle device according to claim 13 and a method for manufacturing of a gas field ion source according to independent claim 14.

According to one embodiment, a gas field ion source is provided. The gas field ion source includes an emitter unit, a cooling unit, and a thermal conductivity unit for thermal conductivity from the cooling unit to the emitter unit, wherein the thermal conductivity unit is adapted for reduced vibration transfer from the cooling unit to the emitter unit.

According to another embodiment, a charged particle beam device is provided. The charged particle beam device includes a gas field ion source. The gas field ion source includes an emitter unit, a cooling unit, and a thermal conductivity unit for thermal conductivity from the cooling unit to the emitter unit, wherein the thermal conductivity unit is adapted for reduction of vibration transfer from the cooling unit to the emitter unit or for reduced vibration transfer from the cooling unit to the emitter unit.

According to a further embodiment, a method of manufacturing a charged particle beam device having a charged particle beam column and a gas field ion source with an emitter unit and a cooling unit. The method includes mounting the emitter unit and the cooling unit mechanically decoupled from each other to the charge particle beam column, and providing a mechanically decoupling thermal conductivity unit between the emitter unit and the cooling unit.

Further advantages, features, aspects and details that can be combined with the above embodiments are evident from the dependent claims, the description and the drawings.

Embodiments are also directed to apparatuses for carrying out the disclosed methods and including apparatus parts for performing each described method steps. These method steps may be performed by way of hardware components, a computer programmed by appropriate software, by any combination of the two or in any other manner. Furthermore, embodiments are also directed to methods by which the described apparatus operates, is manufacture or is maintained. It includes method steps for carrying out every function of the apparatus, manufacturing every part of the apparatus, or maintaining the apparatus.

BRIEF DESCRIPTION OF THE DRAWINGS

Some of the above indicated and other more detailed aspects of the invention will be described in the following description and partially illustrated with reference to the figures. Therein:

FIG. 1 shows a schematic view of a charged particle beam device including an emitter and a cooling unit according to embodiments described herein;

FIG. 2 shows a schematic view of a portion of a charged particle beam device including an emitter and a cooling unit according to embodiments described herein;

FIG. 3 shows a schematic view of a portion of another charged particle beam device including an emitter and a cooling unit according to embodiments described herein;

FIG. 4 shows a schematic view of a portion of an even further charged particle beam device including an emitter and a cooling unit according to embodiments described herein;

DETAILED DESCRIPTION OF THE DRAWINGS

Figure 5A:
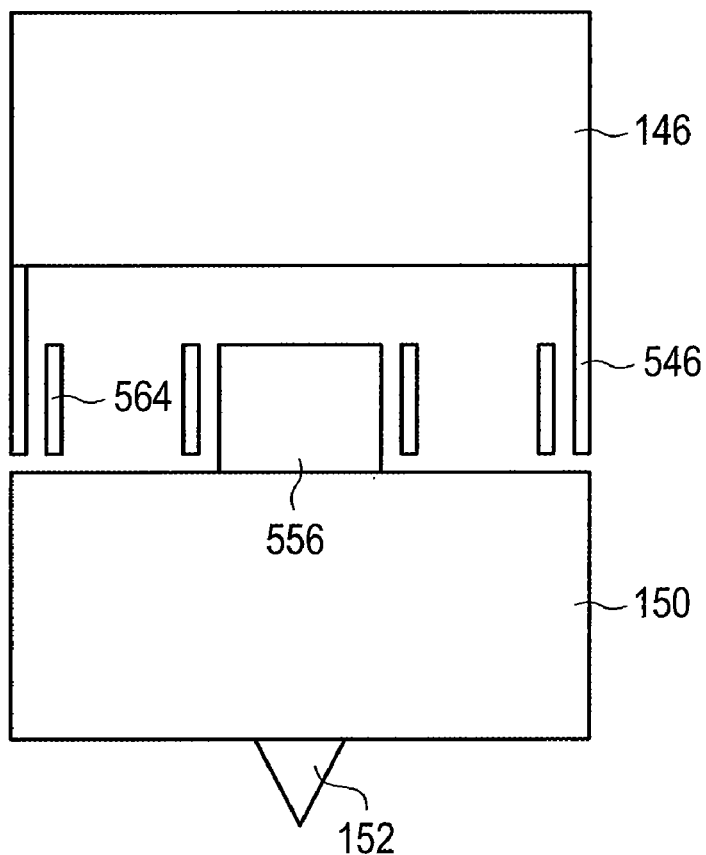
FIG. 5A shows a schematic side view of a portion of a charged particle beam device including an emitter and a cooling unit according to embodiments described herein.

Without limiting the scope, in the following, the charged particle beam device or components thereof will exemplarily be referred to as an ion beam device or components thereof, which detect secondary and/or backscattered electrons. Thereby, the secondary and/or backscattered electrons might be especially utilized during inspection or lithography. The present invention can still be applied for apparatuses and components using other secondary and/or backscattered charged particles to obtain a specimen image, to control patterning of a specimen, for testing, imaging, inspection applications or during specimen modification applications like sputtering, milling or the like.

Within the following description of the drawings, the same reference numbers refer to the same components. Generally, only the differences with respect to the individual embodiments are described.

FIG. 1 shows a charged particle beam device 100. According to embodiments described herein, the charged particle beam device includes a charged particle beam column. Therein, a gun chamber 21 and a further chamber 24 is provided. Within the gun chamber 21 an emitter unit 150 is provided. According to some embodiments, the emitter unit can includes an emitter, e.g., a sharpened single crystal, which is for example made of tungsten, iridium, or the like and which is welded to a supporting wire. Further, a base can be provided. The supporting wire is fixed to the base. According to further embodiments described herein, the base can include a ceramic material.

The emitter unit emits an ion beam essentially along an optical axis of the charged particle beam device. The ion beam can be guided and shaped by beam shaping means like apertures, lenses, deflectors and the like. An objective lens focuses the ion beam on specimen 5, which is positioned on specimen holder 50. On impingement of the primary ion beam on the specimen 5 secondary and/or backscattered particles are released. The secondary and/or backscattered particles can be used for inspection, testing, image generation, or the like. This can be done for testing, imaging and/or inspection applications or during specimen modification applications like sputtering, milling or the like.

According to embodiments described herein, the emitter unit 150 is connected to the charged particle beam column with the connection element acting as an emitter unit support 155. FIG. 1 refers to embodiments, wherein the emitter unit supports connects the emitter unit to a structure between the gun chamber 21 and the further chamber 24.

However, according to other embodiments, it is also possible to connect the emitter unit 150 to other portions of the charged particle beam column. According to different embodiments, the emitter unit can be connected to the charged particle beam column, a housing portion, or a structure portion of the column of the charged particle beam device, directly or indirectly.

For the embodiments in which the emitter unit is directly connected to charged particle beam column, the emitter unit support 155 is connected directly to a portion of the charged particle beam column and directly to the emitter unit.

For the embodiments in which the emitter unit is indirectly connected to the charged particle beam column, the emitter unit support 155 is connected to other elements, which are in turn connected to the charged particle beam column. However, according to embodiments described herein, the emitter unit is connected to the charged particle beam column not via the cooling unit 146. A main source of vibration transfer from the cooling unit to the emitter unit can be avoided by omitting this connection.

Nevertheless, the cooling unit for cooling the emitter unit should still have a thermal conductivity path to the emitter unit.

Therefore, the cooling unit 146 is connected to the column of the charged particle beam device 100 via a vibration decoupling unit 162. Thereby, in particular, the cooling unit 146 is mechanically decoupled with regard to vibrations from the emitter unit 150. The cooling unit and the emitter unit are mechanically decoupled.

According to further embodiments, which can be combined with any of the embodiments described herein, the cooling unit can include any of the following systems: The cooling unit may be cryo-cooler, e.g, open or closed cycle coolers, open or closed cycle Helium coolers, open or closed cycle nitrogen coolers, a combination thereof or another cooler. Particular examples can be pulse tube coolers or GM cooler (Gifford McMahon cooler).

FIG. 1 further shows a thermal conductivity unit 164, which cools the emitter unit and the emitter tip, respectively. According to different embodiments, the thermal conductivity unit for thermal conductivity from the cooling unit to the emitter unit is provided to reduce or avoid transfer of vibrations or other mechanical influences from the cooling unit 146 to the emitter unit 150.

Generally, a reduced transfer of vibrations can also be considered an increased vibration isolation. According some embodiments described herein, which can be combined with any of the other embodiments, a reduced vibration transfer of the thermal conductivity unit can be defined with regard to damping of the vibrations of the cooling unit. According to different embodiments, vibrations from the cooling unit should be damped by the thermal conductivity unit by at least a factor of 10, a factor of 30 or even a factor of 100.

According to one embodiment, as shown in FIGS. 1 and 2, the thermal conductivity unit 164 is provided by a flexible, loosely hanging heat conducting means. As an example, metal wires like copper wires, an array of metal wires like an array of copper wires, or flexible connection comprising a material with a thermal conductivity 100 W/(m·K) or higher can be used. Such materials could be aluminum, graphite, silver, copper, brass or the like.

According to a further embodiment, as shown in FIG. 3, a braid 364 of a metal, like copper braids or an array of metal braids 364 like copper braids, braids of a material with a thermal conductivity of 100 W/(m·K) or higher can be used. Such materials could be aluminum, graphite, silver, copper, brass or the like.

According to an even further embodiment, as shown in FIG. 4, the cooling unit 146 and the emitter unit 150 are connected by a spiral spring thermal conductivity means 464. The spiral heat conducting means 464 can include a material with a thermal conductivity 100 W/(m·K) or higher. Such materials could be aluminum, graphite, silver, copper, brass or the like.

According to even further embodiments, the thermal conductivity unit can be provided by stripes of flexible material with a thermal conductivity of, e.g., 100 W/(m·K) or higher. Generally, the thermal conductivity unit should provide the thermal conductivity between the cooling unit and the emitter unit and should provide a damping of vibrations to reduce vibration transfer, as explained with regard to other embodiments.

According to the embodiment shown in FIG. 1, the cooling unit 146 has a reduced vibration transfer to the emitter unit 150. As shown in FIG. 1, further vibrational decoupling from the cooling unit to the gun chamber is provided by vibration reducing means 162, for example a bellows or the like. According to further embodiments, which can be combined with any of the embodiments described herein, also other means for reducing vibrations transfer from the cooling unit to the charged particle beam column can be used. As an example, a spring support, rubber parts, or other means for vibrations isolation can be used to provide a connection between the cooling unit and the charged particle beam column. However, according to other embodiments, the cooling unit 146 can be directly mounted to the charged particle beam column. Thereby, nevertheless, a transfer of vibrations is also reduced by a thermal conductivity unit, which is decoupling with regard to vibrations from the cooling unit to the emitter unit 150.

Generally, the high resolution gas field ion source charged particle beam devices allow for an improvement in resolution. However, the required cooling for gas field ion sources may introduce vibrations that eliminate high resolution possibilities of gas field ion sources. In light of the embodiments described herein, since the necessity to cool the source to cryo-temperatures is met without transferring the vibrations of the cooling unit to the emitter unit, an improved gas field ion source can be provided. According to embodiments described herein, the emitter unit is not fixed to the cooling unit but rather to the column of the charged particle beam device. The heat transfer between the emitter and the cool head is provided by flexible heat conducting means, which provide a decoupling with regard to vibrations. Thus, the emitter is mechanically decoupled from the vibrating cooling head and the mechanical stability of the emitter unit including the emitter tip is increased.

Figure 5B:
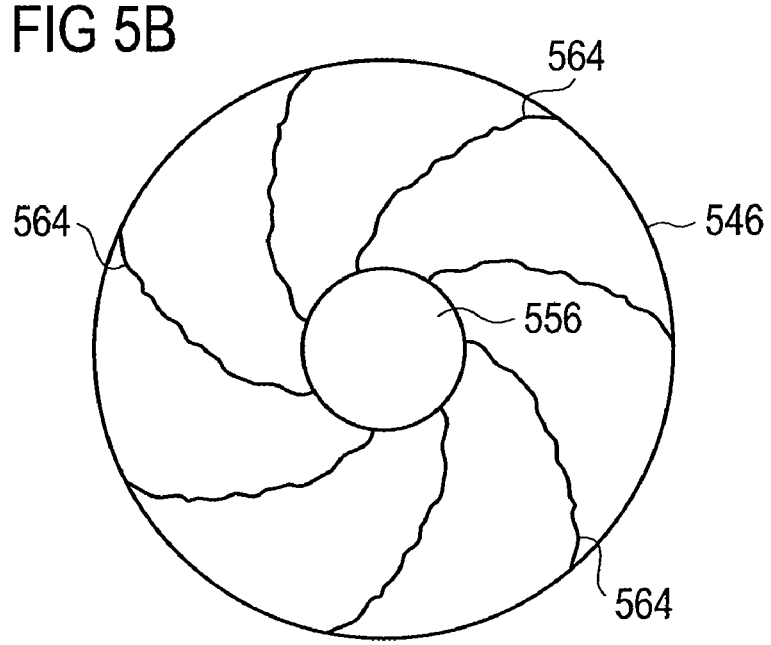
FIG. 5B shows a schematic top view of FIG. 5A.

FIGS. 5a and 5b show a further embodiment for mechanical decoupling of a cooling unit 146 and an emitter unit 150. FIG. 5a shows a side view of the cooling unit 146 and shows protruding portion 546. According to one embodiment, as shown in FIG. 5a, the protruding portion 546 of the cooling unit can be provided at the outer region or the perimeter of the cooling unit 146. The emitter unit 150 has a protruding portion 556. As shown in FIG. 5a, the protruding portion 556 of the emitter unit 150 can be provided in the center or an inner region of the emitter unit 150. The protruding portion 546 of the cooling unit 146 and the protruding portion 556 of the emitter unit 150 are thermally connected with each other by the thermal conductivity unit 564. The thermal conductivity unit 564 includes a plurality of wires or braids which are horizontally provided between protruding portions of the cooling unit and the emitter unit.

The thermal conductivity unit 564 can typically include one or more wires or braids, which are provided in a spiral manner from the outer protrusion to the inner protrusion. Thereby, as an example, the wires or braids can extend along about 45° to 135°.

According to some embodiments described herein, the protruding portions of the cooling unit and the protruding portion of the emitter unit overlap in a first direction. Thereby, the braid/wire or the braids/wires can be provided to extend in a plane perpendicular to the first direction. The protruding portions in combination with the horizontally extending thermal conductivity units allow reducing the required space in the height direction.

Figure 6:
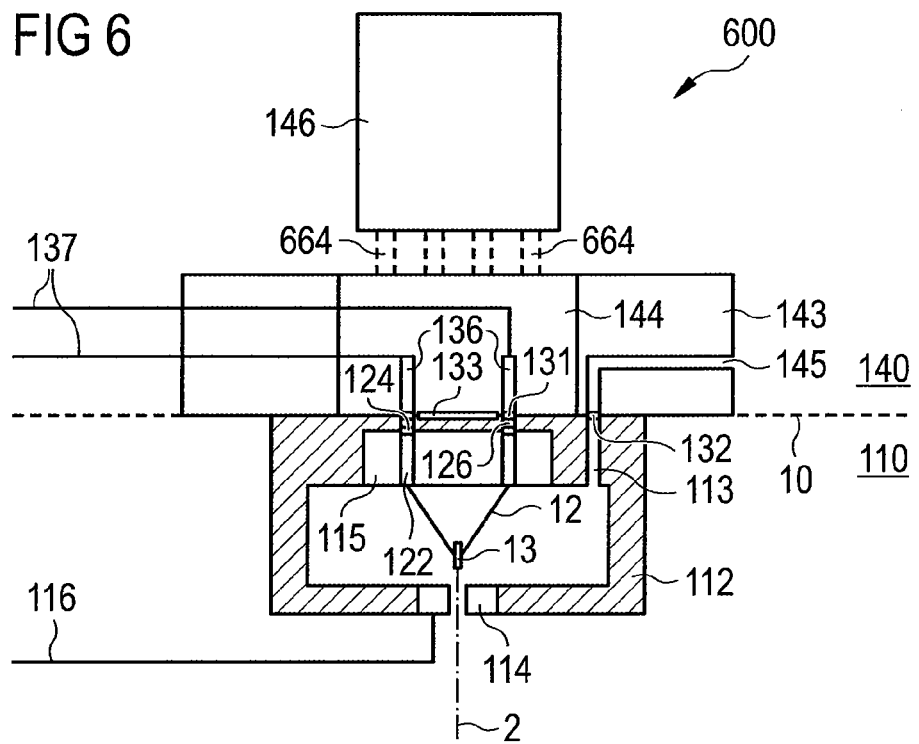
FIG. 6 shows a schematic side view of a portion of yet another charged particle beam device including an emitter and a cooling unit according to embodiments described herein.

As another example, as shown in FIG. 6, the gas field ion source can optionally be provided as follows. The gas field ion source 600 includes a cooling unit 146 and an emitter unit 110/140. According to some embodiments, which can be combined with any of the embodiments described herein, an emitter module 110 and the supply module 140 are provided. FIG. 6 shows the supply module and the emitter module separated by dashed line 10. Between the emitter module 110 and the supply module 114 a plurality of connections are provided, which are detachably connectable. Thus, the emitter module 110 and the supply module 114 can be provided substantially independent from each other the emitter module is easily replaceable.

Cooling to cryo temperatures, high voltage, heating current and gas can be supplied to the emitter module, whereby a complicated and difficultly structures that are difficult to maintain can be omitted. Thus, the replacement of the emitted tip can be more easily conducted with the modular gas field ion source 100.

As shown in FIG. 6, an easily replaceable emitter module 110 for the gas field ion source 100 is provided according to embodiments described herein. Thereby, an emitter structure includes an emitter 13, e.g., a sharpened single crystal, which is for example made of tungsten, iridium, or the like and which is welded to a supporting wire 12. Further, a base 115 is provided. The supporting wire is fixed to the base 115. According to further embodiments described herein, the base can include a ceramic material.

The emitter module 110 further includes an emitter holder. According to one embodiment, the emitter holder has a cup-like structure. For example, it has a circular shape when seen from the top. The emitter holder 112 may, according to further embodiments, surround the emitter tip 13 and has, for example, the purpose of containing the gas for the gas field ion source and supporting the extraction electrode 114. The extraction electrode 114 acts as a counter electrode to the positively biased emitter during operation.

According to an even further embodiment, the extraction voltage can be supplied by conductor 116.

According to one embodiment, as shown in FIG. 6 conductors 122 are embedded in the base 115 and have connections 124, which provide an electrical contact of the conductor 122 within the base 115 and the conductor 126 within the emitter holder 112. Thereby, a high-voltage for the gas field ion source and a heating current can be supplied via the supporting wire 12 to the emitter tip 13.

The emitter holder 12 further includes a gas conduit 113 for providing the gas used for the gas field ion source.

The supply module 140 includes the main body 142. The main body 142 has a first portion 143 and a second portion of 144. Generally, high voltage supply conductors 137 and 136 and a gas conduit 145 are provided.

According to some embodiments, which can be combined with any of the embodiments described herein, the high voltage supply conductors can also be used for providing a heating current to the emitter. According to alternative embodiments, which can also be yielded by a combination with any of the embodiments described herein, heating current conductors can additionally be provided. According to further embodiments, which can be combined with any of the embodiments described herein, a thermal conductivity between the supply module and the emitter module can be provided via any, or all of the electrical conductors or thermal conduction means can additionally or alternatively be provided.

Further, according to one embodiment, the thermal conductor is provided by the second portion 144. According to an even further embodiment, the thermal conductor includes an electrical insulator with a high thermal conductivity, for example, sapphire or the like.

According to embodiments described herein, the supply module 140 supplies the functions of cooling, high-voltage, heating current, and gas supply.

According to further embodiments, two or more conduits, that is gas inlets, can be provided. Thereby, a focused ion beam device further can include an ion beam column including an emitter area for generating ions, a first gas inlet adapted to introduce a first gas to the emitter area, a second gas inlet adapted to introduce a second gas different from the first gas to the emitter area, and a switching unit adapted to switch between introducing the first gas and introducing the second gas. According to other embodiments, a focused ion beam device can be provided, wherein the focused ion beam device includes an ion beam column including an emitter area for generating ions, means for switching between introducing a light gas into the emitter area for an observation mode and introducing a heavy gas into the emitter area for a modification mode, wherein the light gas is selected from the group consisting of hydrogen and helium and the heavy gas has an atomic mass of 10 g/mol or higher. According to yet other embodiments, a method of operating a focused ion beam device can be provided. The method includes biasing an emitter within an emitter area wherein ions are generated, switching between introducing a light gas to the emitter area and a heavy gas to the emitter area, wherein the light gas is selected from the group consisting of hydrogen and helium and the heavy gas has an atomic mass of 10 g/mol or higher. These and other modifications in order to yield further embodiments are for example disclosed in commonly assigned and co-pending European application No. 06026210.2, filed Dec. 18, 2006, entitled "Gas Field ion source for multiple applications", which is incorporated herein by reference in its entirety for the purpose of describing modification to insert two or more gases, that is respective apparatuses and/or methods.

In order to provide the modular concept and, additionally an easy separation substantially along the line 10, both the emitter module 110 and the supply module 140 include detachably connectable connections for high-voltage, and gas supply. According to further embodiments, additional connections for cooling and heating current can be provided, particularly in the case that the connections for high-voltage and gas supply do not provide a transfer means for cooling and heating current. In FIG. 1, the electrical connections are indicated by reference numbers 131, the thermal conductor connection is indicated by reference number 133 and the gas supply connection is indicated by reference number 132. According to other embodiments, the thermal conductor connection can, additionally or alternatively, be provided by the electrical connections.

According to embodiments described herein, the detachably connectable connections are provided at the interface (see, e.g., line 10 in FIGS. 1-4) between the emitter module and the supply module.

According to an even further embodiment, which can be combined with any of the other embodiments described herein, the emitter module and the supply module are adapted to allow a separation between or connection of the modules during which the detachably connectable connection assemblies of the emitter module and the corresponding detachably connectable connection assemblies of the supply module are separated or connected, respectively. Accordingly, the gas field ion source allows for an easy separation of the emitter module and the supply module. Thereby, maintenance of the modular gas field ion source can be conducted more easily.

According to one embodiment, the installation of the emitter module, which is to be replaced during regular maintenance, can be done by pressing the detachably connectable electrical connectors of the emitter module into a bushing in the supply module. However, according to further embodiments, connection methods like fixing screws or a concentric screw-nut are also possible. Thereby, all supplies for operating the gas field ion source are connected.

According to embodiments described herein, the emitter structure including the ceramic base 115, the supporting wire 12 and the emitter tip 13 may advantageously be similar to emitters structures used for cold field electron emission (CFE). Thereby, easily available emitter structures, which have previously been used, can be provided for the modular gas field ion source. Maintenance of a modular gas field ion source microscope can, therefore, be made even easier.

The emitter structure can, according to specific embodiments, be fixed to the emitter holder 112 by screws, or the like. Thereby, according to even further embodiments, an alignment of the emitter structure (115, 12, 13) and the emitter holder 112 may optionally be provided.

The emitter module 110 which is formed thereby can be connected to the supply module 140. Thereby, according to embodiments described herein, within one step, electrical connections, gas connections and cooling are provided.

According to an alternative embodiment, which can be combined with other embodiments described herein, loosening of one or more of the connection assemblies or opening of fasteners for one or more of the connection assemblies can additionally be conducted. However, the emitter module can be removed from or are placed at the supply module such that the detachably connectable connections assemblies are connected or at least in position for fastening the connections.

As described above, during maintenance, an emitter module can be removed from the gas field ion source in one piece and a new emitter module can be placed in the gas field ion source in one piece. Thereby, all connections are provided and/or ready for being locked. Further, according to other embodiments, the emitter structure may be placed in the emitter module before the emitter module is placed in the gas field ion source. Thereby, an alignment of the emitter structure and, thereby the emitter can optionally be provided. According to an even further embodiment, the emitter module is provided in an aligned position in the gas field ion source, that is, adjacent to the supply module or can be aligned after connecting the emitter module and the supply module.

The embodiments, which are described above with respect to FIG. 6 allow an easy separation between the supply module and the emitter module. As described with respect to FIGS. 1 to 5, a cooling unit 146 may introduce vibrations to the emitter. This is also true for the embodiments in which the emitter unit is divided into a supply module and an emitter module. Thus, the cooling unit should be mechanically decoupled from the emitter unit.

Accordingly, the cooling unit 146 and the emitter unit 110/140, which are shown in FIG. 6, are connected with each other by an array of braids 664. The braids provide a thermal conductivity without transfer of vibrations. According to further embodiments, the modular emitter unit, which is described above, con be combined with any of the other embodiments described herein.

Figure 7:
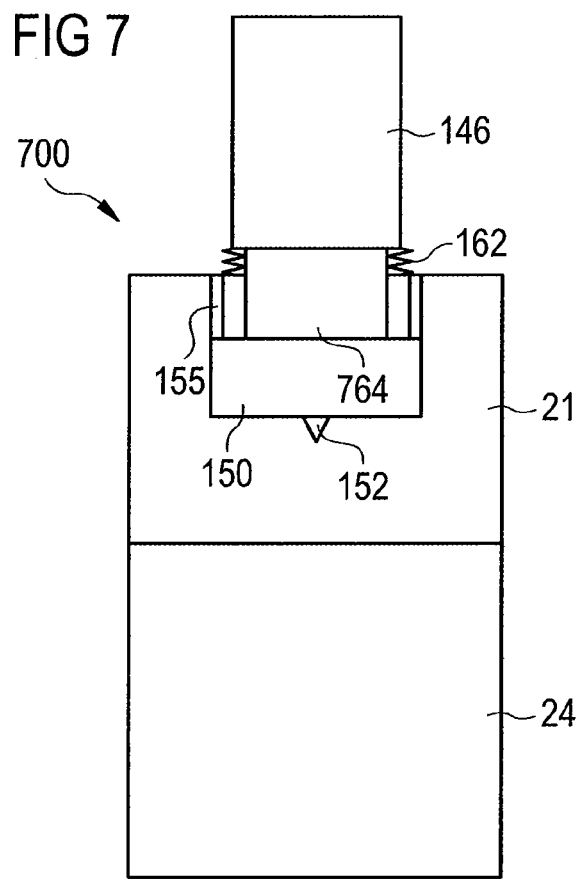
FIG. 7 shows a schematic view of a charged particle beam device including an emitter and a cooling unit according to embodiments described herein.

FIG. 7 shows a further embodiment of a charged particle beam device 700. The charged particle beam device 700 includes a column with a gun chamber 21 and a further chamber 24. Within the gun chamber 21 the emitter unit 150 including the emitter 152 is provided. The emitter unit 150 is connected to an upper portion of the gun chamber 21 and, therefore the charged particle beam column by a holder, which is an emitter unit support 155. The charged particle beam device 100 further includes a cooling unit 146 which is connected to the charged particle beam column with a mechanically decoupling connection means 162.

According to one embodiment a bellows or the like can be used for connecting the cooling unit 146 to the charged particle beam column. FIG. 7 shows a thermal conductivity unit 764 which provides thermal conductivity between the cooling unit 146 and the emitter unit 150. The thermal conductivity unit 764 can be, according to one embodiment, a space filled with a thermally conductive gas such as helium or the like. Thereby, the vibrations from the cooling unit 146 are decoupled from the emitter unit 150 and the thermal conductivity is still provided by the thermally conductive gas. According to even further embodiments, the emitter unit can be provided according to any of the embodiments described above.

Figure 8:
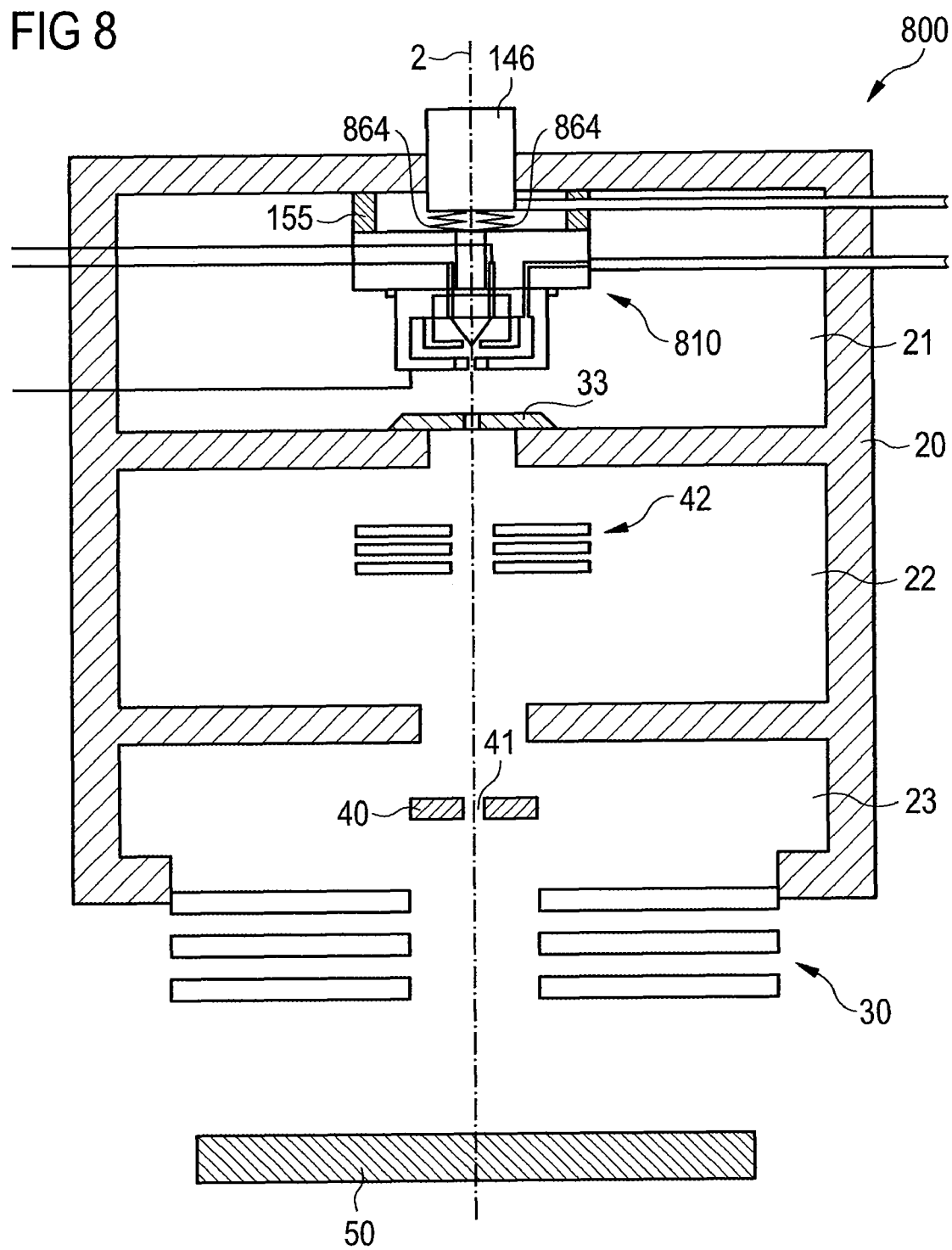
FIG. 8 shows a schematic view of a charged particle beam device including an emitter and a cooling unit according to further embodiments described herein.

FIG. 8 shows a charged particle beam device 800. The ion beam device includes a column 20. Therein a gas field ion source 810 according to any of the embodiments described herein can be provided. The primary beam is emitted essentially along optical axis 2. The gun chamber housing 21 is separated by aperture 33 from the following chamber 22. The primary ion beam is formed and guided by condenser lens 42.

The primary ion beam passes through the opening 12 in detector 40 and is focused by objective lens 30 on the specimen 5, which located on the specimen holder 50. Secondary and/or backscattered particles, which are released on impingement of the primary ion beam, can be detected by detector 40 for image generation. The emitter unit 810 is connected to the gun chamber housing and, thus, the column 20 via holder 55. The cooling unit is connected to the column 20. Thereby, no direct vibration transfer connection between the cooling unit 146 and the emitter unit 810 is provided. The thermal conductivity between the cooling unit 146 and the emitter is provided by thermal conductivity unit 864, which transfers heat while mechanically decoupling the cooling unit and the emitter unit in order to reduce transfer of vibrations from the cooling unit to the emitter.

According to embodiments described herein a gas field ion source for a charged particle beam device having a charged particle beam column can be provided. The gas field ion source includes an emitter unit, a cooling unit, and a thermal conductivity unit for thermal conductivity from the cooling unit to the emitter unit, wherein the thermal conductivity unit is adapted for reduction of vibration transfer from the cooling unit to the emitter unit.

Generally, for embodiment described herein, a reduced transfer of vibrations can also be considered an increased vibration isolation. According to different embodiments, vibrations from the cooling unit can be damped or reduced by a thermal conductivity unit by at least a factor of 10, a factor of 30 or even a factor of 100.

According to further embodiments, an emitter unit support for connecting the emitter unit with a portion of the charged particle beam column can be provided. Typically, the emitter unit support connects the emitter unit to the portion of the charged particle beam column such that the connecting means excludes a connection with or via the cooling unit. According to yet further embodiments, it is possible that the thermal conductivity unit includes a flexible wire or braid. Optionally, the flexible wire or braid can consist of a material with a thermal conductivity of 100 W/(m·K) or higher. Additionally or alternatively the flexible wire or braid includes at least one material selected from the group consisting of: copper, aluminum, brass, silver, and a combination thereof.

According to yet further embodiments, the wire or braid of the thermal conductivity unit includes can extend between a protruding portion of the cooling unit and a protruding portion of the emitter unit. Thereby, it is typically possible that the wire or braid extends horizontally. According to even further embodiments, the thermal conductivity unit can include a gas filled space.

According to even further embodiments, the gas field ion source can include: an emitter module having an emitter holder, an emitter structure, a detachably connectable electrical connection assembly of the emitter module, and detachably connectable gas supply connection assembly of the emitter module. The gas field ion source can further include supply module having at least one electrical conductor for providing voltage and/or current, a gas supply conduit, a thermal conductor, a detachably connectable electrical connection assembly of the supply module, and a detachably connectable gas supply connection assembly of the supply module, wherein the emitter module and the supply module are detachably connectable by the detachably connectable connection assemblies of the emitter module and the detachably connectable connection assemblies of the supply module. Additionally, the emitter module can further include a detachably connectable thermal conductivity connection assembly of the emitter module and a detachably connectable thermal conductivity connection assembly of the supply module;

According to yet further embodiments, a charged particle beam device can be provided, which includes a gas field ion source according to any of the embodiments described herein.

According to yet further embodiments, methods of manufacturing a charged particle beam device having a charged particle beam column and a gas field ion source with an emitter unit and a cooling unit are provided. The methods can include mounting the emitter unit and the cooling unit mechanically decoupled from each other to the charge particle beam column, and providing a mechanically decoupling thermal conductivity unit between the emitter unit and the cooling unit.

While the foregoing is directed to embodiments of the invention, other and further embodiments of the invention may be devised without departing from the basic scope thereof, and the scope thereof is determined by the claims that follow.

The invention claimed is:

1. A gas field ion source for a charged particle beam device having a charged particle beam column, comprising:
    an emitter unit;
    a cooling unit;
    a thermal conductivity unit for thermal conductivity from the cooling unit to the emitter unit, wherein the thermal conductivity unit includes a flexible wire, strip or braid extended between a protruding portion of the cooling unit and a protruding portion of the emitter unit and is adapted for reducing vibration transfer from the cooling unit to the emitter unit, the protruding portion of the cooling unit and the protruding portion of the emitter unit being overlapped in a first direction, and wherein the flexible wire, strip or braid of the thermal conductivity unit extends in a plane perpendicular to the first direction; and
    an emitter unit support for connecting the emitter unit with a portion of the charged particle beam column, wherein the emitter unit is indirectly connected to the cooling unit.

2. The gas field ion source according to claim 1, wherein the emitter unit support is adapted for reducing vibration transfer from the cooling unit to the charged particle column.

3. The gas field ion source according to claim 1, wherein the flexible wire, strip or braid consist of a material with a thermal conductivity of 100 W/(m·K) or higher.

4. The gas field ion source according to claim 1, wherein the flexible wire, strip or braid includes at least a material selected from the group consisting of: copper, aluminum, brass, silver, and a combination thereof.

5. The gas field ion source according to claim 1, wherein the thermal conductivity unit includes a gas filled space.

6. The gas field ion source according to claim 1, further comprising:
    an emitter module, comprising:
        an emitter holder;
        an emitter structure;
        a detachably connectable electrical connection assembly of the emitter module; and a detachably connectable gas supply connection assembly of the emitter module; and the gas field ion source further comprises a supply module, the supply module comprising:

at least one electrical conductor for providing voltage and/or current;

a gas supply conduit;

a thermal conductor;

a detachably connectable electrical connection assembly of the supply module; and a detachably connectable gas supply connection assembly of the supply module, wherein the emitter module and the supply module are detachably connectable by the detachably connectable connection assemblies of the emitter module and the detachably connectable connection assemblies of the supply module.

7. The gas field ion source according to claim 6, wherein the emitter module further comprises:

a detachably connectable thermal conductivity connection assembly of the emitter module, wherein the supply module further comprises:

a detachably connectable thermal conductivity connection assembly of the supply module.

8. The gas field ion source according to claim 1, wherein the emitter unit comprises:

a base;

a supporting wire connected to the base; and an emitter tip connected to the supporting wire.

9. A charged particle beam device, comprising:

a gas field ion source for a charged particle beam device having a charged particle beam column, the gas field ion source comprising:

an emitter unit; and a cooling unit;

a thermal conductivity unit for thermal conductivity from the cooling unit to the emitter unit, wherein the thermal conductivity unit includes a flexible wire, strip or braid extended between a protruding portion of the cooling unit and a protruding portion of the emitter unit and is adapted for reducing vibration transfer from the cooling unit to the emitter unit, the protruding portion of the cooling unit and the protruding portion of the emitter unit being overlapped in a first direction, and wherein the flexible wire, strip or braid of the thermal conductivity unit extends in a plane perpendicular to the first direction; and an emitter unit support for connecting the emitter unit with a portion of the charged particle beam column, wherein the emitter unit is indirectly connected to the cooling unit.

10. A method of manufacturing a charged particle beam device comprising a gas field ion source for a charged particle beam device having a charged particle beam column, the gas field ion source having an emitter unit and a cooling unit, a thermal conductivity unit for thermal conductivity from the cooling unit to the emitter unit, wherein the thermal conductivity unit includes a flexible wire, strip or braid extended between a protruding portion of the cooling unit and a protruding portion of the emitter unit and is adapted for reducing vibration transfer from the cooling unit to the emitter unit, the protruding portion of the cooling unit and the protruding portion of the emitter unit being overlapped in a first direction, and wherein the flexible wire, strip or braid of the thermal conductivity unit extends in a plane perpendicular to the first direction, and an emitter unit support for connecting the emitter unit with a portion of the charged particle beam column, wherein the emitter unit is indirectly connected to the cooling unit, the method comprising:

mounting the emitter unit and the cooling unit mechanically decoupled from each other to the charge particle beam column; and providing a mechanically decoupling thermal conductivity unit between the emitter unit and the cooling unit.

11. The method of manufacturing a charged particle beam device according to claim 10, further comprising:

reducing vibration transfer from the cooling unit to the charged particle beam column.

12. The method of manufacturing a charged particle beam device according to claim 10, further comprising:

placing an emitter structure having a base, a supporting wire and an emitter tip in an emitter holder of the emitter unit.

13. The method of manufacturing a charged particle beam device according to claim 10, further comprising:

aligning the emitter structure in the charged particle beam column.

14. The gas field ion source according to claim 1, wherein the cooling unit is mechanically decoupled from the emitter unit with regard to vibrations from the emitter unit.

15. The charged particle beam device according to claim 9, wherein the cooling unit is mechanically decoupled from the emitter unit with regard to vibrations from the emitter unit.

* * * * *